United States Patent
Murakami et al.

(10) Patent No.: US 6,726,493 B2
(45) Date of Patent: Apr. 27, 2004

(54) METHOD AND STRUCTURE FOR CONNECTING AND ALIGNING ELECTRICAL CONNECTIONS DISPOSED ON DEVICES BY FITTING ONE DEVICE INTO AN OPENING ON ANOTHER DEVICE

(75) Inventors: Takao Murakami, Shizuoka-ken (JP); Masaru Fukuda, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/982,966

(22) Filed: Oct. 22, 2001

(65) Prior Publication Data

US 2002/0048977 A1 Apr. 25, 2002

(30) Foreign Application Priority Data

Oct. 20, 2000 (JP) ...................... P2000-321437

(51) Int. Cl.[7] ........................ H01R 13/44; H01R 13/05; H01R 9/09
(52) U.S. Cl. ...................... 439/130; 439/825; 174/266
(58) Field of Search ................. 439/130, 76.1, 439/76.2, 825, 75; 361/752; 174/266

(56) References Cited

U.S. PATENT DOCUMENTS 6,233,153 B1 * 5/2001 Baur et al. .................. 361/752
6,514,090 B1 * 2/2003 Neal et al. .................... 439/75

* cited by examiner

Primary Examiner—Chandrika Prasad
(74) Attorney, Agent, or Firm—Finnegan, Henderson, Farabow, Garrett & Dunner, L.L.P.

(57) ABSTRACT

A connection method and structure of devices which need an electrical connection. A first device is provided with a fitting opening for fixedly fitting a second device thereinto and a circuit substrate on which a conductor extended from the periphery of the fitting opening to the inner periphery thereof to be a first terminal is printed, and a second device is provided with a second terminal on the outer periphery of a part which is fitted into the fitting opening. The first terminal is folded on the inner periphery of the fitting opening, and when the second device is fitted into the fitting opening, the first terminal of the fitting opening of the first device is connected electrically to the second terminal of the outer periphery of the second device.

14 Claims, 2 Drawing Sheets

METHOD AND STRUCTURE FOR CONNECTING AND ALIGNING ELECTRICAL CONNECTIONS DISPOSED ON DEVICES BY FITTING ONE DEVICE INTO AN OPENING ON ANOTHER DEVICE

BACKGROUND OF THE INVENTION

1. Field of the Invention

The present invention relates to a method and a structure of connecting devices which need an electrical connection.

2. Description of the Related Art

In the case where connected devices involving an electrical connection are connected, in general, they are electrically connected via a harness after fixing a device to the other device. For example, in the case where an ignition coil is attached to an engine main body of an automobile, an igniter portion of the ignition coil is connected with a distributor via an ignition cable that is a harness, and further the distributor is connected with an ignition plug.

A pair of connectors are employed for the connection between the igniter portion and the ignition cable. The connector of one side is integrally formed with a head portion of the ignition coil containing the igniter portion in a protruding manner. The other connector is connected with the end of the ignition cable extending from the distributor.

After attaching the ignition coil to the engine main body, by inserting the one connector into the other connector, they are electrically connected. Furthermore, liquidtightness inside the connectors is ensured by means of a packing provided in the other connector.

SUMMARY OF THE INVENTION

In the device connection method described above, work to connect the pair of connectors is necessary after attaching the ignition coil to the engine main body. Moreover, inspection after the work is necessary with respect to each of the attaching and the connecting of the connectors. Thus, process is complicated, thereby becoming a factor in a rise of manufacturing cost.

Further, in the device connection method, a disadvantage is that there are many electrical contact points. It is necessary to ensure not only regarding the connection between the connectors but also regarding the connection between the connector and the ignition coil and between the connector and the ignition cable. Thus, it becomes necessary to take counter measures for liquid tightness and prevention of falling off for each contact point. Therefore, the number of components becomes large, thereby increasing the possibility of failure as well as raising in a cost of components.

The present invention was made considering the above-described circumstances, and it is an object of the present invention to provide a device connection method by which an electrical connection can be ensured only by connecting devices and the reduction in manufacturing procedure and cost can be achieved.

A first aspect of the present invention provides a connection method of devices which need an electrical connection wherein a first device is provided with a fitting opening for fixedly fitting a second device thereinto and a circuit substrate on which a conductor extended from the periphery of the fitting opening to the inner periphery thereof to be a first terminal is printed, and a second device is provided with a second terminal coming into contact with the first terminal on the outer periphery of a part which is fitted into the fitting opening. The first terminal is folded on the inner periphery of the fitting opening, and when the second device is fitted into the fitting opening, the first terminal and the second terminal are connected electrically.

In this connection method, when the second device is fixedly fitted into the first device, the first terminal of the fitting opening of the first device is connected electrically to the second terminal of the outer periphery of the second device. The printed conductor of the circuit substrate provided on the periphery of the fitting opening of the first device is extended and is folded on the inner periphery of the fitting opening to form and arrange the first terminal, and the second terminal is electrically connected with the printed conductor of the substrate. Accordingly, only by fitting the second device into the first device, an electrical connection becomes possible, and the work is remarkably simplified. Since the folded part to be the first terminal in the substrate is sandwiched between the fitting opening and the second terminal to be fixed, the electrical connection is further stable and reliable. Since a connector is not used, the number of components is reduced.

According to a second aspect of the present invention, there is provided a connection method wherein positioning means for defining the relative position between the first device and the second device is further provided. With this means, a normal electrical contact state between the first terminal and the second terminal can be maintained constantly in the fitting state of the devices, and imperfect contact can be prevented.

According to a third aspect of the present invention, the method according to the first aspect of the invention further comprising the step of inserting an annular seal member surrounding the fitting opening between the circuit substrate and the first device and between the substrate and the second device.

DETAILED DESCRIPTION OF THE PREFERRED EMBODIMENT

Figure 1:
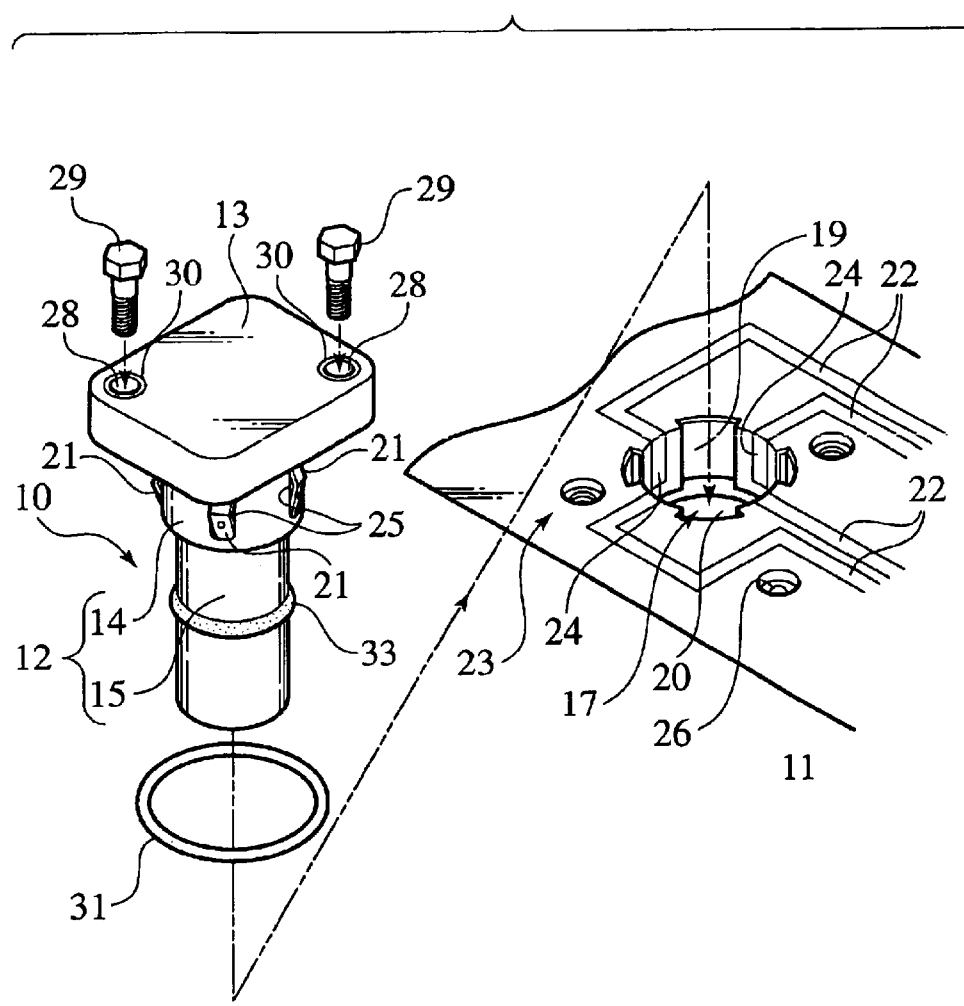
FIG. 1 is an exploded perspective view showing a device connection method according to a first embodiment of the present invention.
Figure 2:
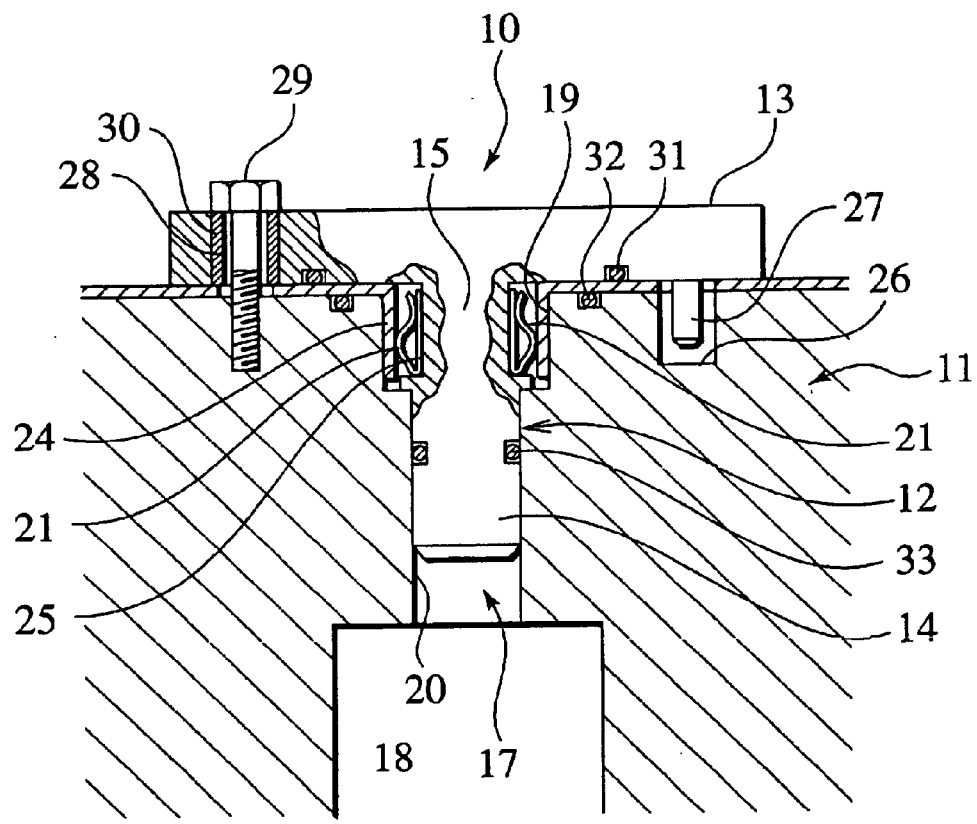
FIG. 2 is a sectional view of a main part in a fitting state of devices according to the first embodiment of the present invention.

A first embodiment of the present invention is explained in detail referring to the accompanying drawings. In the present embodiment, a case where a cylinder head 11 of an engine is employed as the first device and an ignition coil device 10 is employed as the second device are explained as examples.

A main body portion 12 of the ignition coil device 10 is formed into a cylindrical shape, and its upper end has a rectangular head portion 13. The head portion 13 side of the main body portion 12, which is a fitting portion 14 to be fitted with a cylinder head 11, has a diameter larger than that of a fixing portion 15 of the lower end thereof.

An ignition coil attaching hole 17 for fixedly fitting the main body portion 12 of the ignition coil device 10 is provided in the cylinder head 11. This ignition coil attaching hole 17 passes a cylinder bore 18 through, the vicinity of the opening portion thereof is a fitting opening 19 into which the fitting portion 14 is fitted having an appropriate gap, and a support portion 20 into which the fixing portion 15 is closely fitted is formed in the inside facing the cylinder bore 18.

The ignition coil device 10 is provided with a second terminal 21 on the outer periphery of the fitting portion 14 for the fitting opening 19, the cylinder head 11 is provided with a circuit substrate 23 on which a conductor 22 is printed on the periphery of the fitting opening 19, and the conductor 22 is extended on the inner periphery to be a first terminal 24. This first terminal 24 is folded on the inner periphery of the fitting opening 19 to be arranged there and is connected electrically to the second terminal 21 when the ignition coil device 10 is fitted into the fitting opening 19. In the present embodiment, an FPC (Flexible Printed Circuit) is employed as the substrate 23.

The second terminal 21 is folded in two to be formed into a plate spring shape to which resiliency toward the outside is imparted so that an arc-like portion protruding outward becomes a contact. Four of the second terminals 21 are provided, and the respective second terminals 21 are accommodated in attaching recesses 25 provided at equal intervals in the peripheral direction of the fitting portion 14 so that the contact portions thereof protrude. On the other hand, corresponding to the second terminals 21, four of the first terminals 24 are provided at equal intervals on the inner periphery of the fitting opening 19. That is, four of the conductors 22 printed on the substrate 23 are provided corresponding to the respective first terminals 24. In the present embodiment, although the numbers of the terminals 21 and 24 are set to four, the present invention is not limited to this, and the number can be a necessary arbitrary one.

A positioning hole 26 parallel to the fitting direction of the ignition coil device 10 is provided in the periphery of the ignition coil attaching hole 17 of the cylinder head 11. A positioning pin 27 is provided on the lower face of a corner of the head portion 13 of the ignition coil device 10, and positioning means is composed of this pin 27 and the positioning hole 26. That is, the relative position between the first terminal 24 and the second terminal 21 is determined by fitting of the positioning hole 26 and the positioning pin 27.

Respective attaching holes 28 are provided in a pair of corners except for a corner having the positioning pin 27 and the opposite corner thereof in the head portion 13 of the ignition coil device 10. Bolts 29 inserted into the attaching holes 28 is threaded into the substrate 23 to be screwed onto the cylinder head 11, whereby tightening and fixing of the ignition coil device 10 is executed. At this time, collars 30 for receiving the tightening force of the bolts 29 are threaded into the attaching holes 28. Accordingly, when the head portion 13 is tightened and fixed as described above, the substrate 23 comes to be fixed between the head portion 13 and the cylinder head 11 by pressure.

O-rings 31 and 32 are inserted between the substrate 23 and the head portion 13 and between the substrate 23 and the cylinder head 11, each centering on the ignition coil attaching hole 17, and the head portion 13 is supposed to press-contact with these. When the head portion 13 is tightened, the respective O-rings 31 and 32 are fixed to the substrate 23 by pressure to seal up the space between the head portion 13 and the cylinder head 11. In the present embodiment, since an O-ring 33 is inserted between the fixing portion 15 of the ignition coil device 10 and the support portion 20 of the ignition coil attaching hole 17, airtightness in the cylinder bore 18 can be ensured, in combination with the O-rings 31 and 32.

Accordingly, in the device connection method of the present embodiment, the ignition coil device 10 is stuck into the ignition coil attaching hole 17 while the positioning pin 27 is inserted into the positioning hole 26, so that the fitting portion 14 on which the second terminals 21 are arranged is positioned inside the fitting opening 19 on which the first terminals 24 are arranged. Then, the terminals 21 and the terminals 24 are connected electrically, and the ignition coil device 10 and the conductor 22 of the substrate 23 with which the cylinder head 11 is provided are electrically connected. In the present embodiment, since an electrical connection can be ensured at the same time as the ignition coil device 10 is fitted into the fitting hole 19 of the cylinder head 11, connection work employing a conventional complex, expensive connector by a harness becomes unnecessary.

Moreover, since the folded portion of the substrate 23 to be the first terminal 24 is sandwiched between the inner periphery of the fitting opening 19 and the second terminal 21 of the outer periphery of the fitting portion 14 to be fixed, stability of the contact between these first terminal 24 and second terminal 21 can be ensured.

Further, since the positioning hole 26 and the positioning pin 27 are provided between the ignition coil device 10 and the cylinder head 11 when the ignition coil device 10 is fixedly fitted into the ignition coil attaching hole 17, the position in the rotation direction of the cylinder head 11 and the ignition coil device 10 can be decided simply and correctly by the insert position of the positioning hole 26 and the positioning pin 27. Thus, in the state where the ignition coil device 10 is fitted, a normal electrical contact state between the first terminal 21 and the second terminal 24 can be maintained constantly, and it can be prevented that these parts are in imperfect contact.

Since the O-rings 31 and 32 are inserted between the substrate 23 and the head portion 13 of the ignition coil device 10 and between the substrate 23 and the cylinder head 11, the fitting portion of the ignition coil device 10 can be sealed up by the O-rings 31 and 32, whereby waterproof function can be ensured. In the present embodiment, not only can the waterproof function be demonstrated as described above, the airtightness of the ignition coil attaching hole 17 can be ensured by the O-ring 33 which is inserted between the fixing portion 15 of the ignition coil device 10 and the support portion 20 of the ignition attaching hole 17, whereby it can be prevented that combustion pressure inside the cylinder bore 18 escapes.

Figure 3:
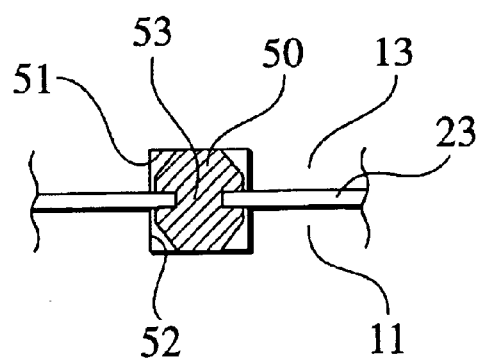
FIG. 3 is an enlarged sectional view of a seal part in a device connection method according to a second embodiment of the present invention.

In a second embodiment of the present invention, as shown in FIG. 3, the substrate 23 is provided with a rubber packing 50 integrally formed therewith. The head portion 13 of the ignition coil device 10 and the cylinder head 11 are provided with annular grooves 51 and 52 opposed to each other, respectively, and the rubber packing 50 is inserted into these grooves. When the head portion 13 is tightened by means of the bolt 29, at the same time, close adherence between the rubber packing 50 and the head portion 13 and between the rubber packing 50 and the cylinder head 11 can be achieved, whereby airtightness can be ensured.

In the above two embodiments, although an example is employed where the cylinder head 11 is employed as the first device and the ignition coil device 10 is employed as the second device, of course, the present invention is not limited to this example and can be applied to various cases of the connection between a first device and a second device which mutually need an electrical connection.

What is claimed is:

1. A connection method of a first device and a second device involving an electrical connection, comprising the steps of:
   providing an opening on the first device for fitting the second device into the first device;
   arranging a substrate on which at least three conductors are printed on the periphery of the opening;
   providing at least three first terminals by extending and folding the at least three conductors on an inner part of the opening;
   providing at least three second terminals on the second device corresponding to the at least three first terminals on the first device; and
   making the at least three first terminals and the at least three second terminals respectively come into contact by fitting the second device into the opening.

2. A connection method of a first device and a second device involving an electrical connection, comprising the steps of:
   providing an opening on the first device for fitting the second device into the first device;
   arranging a substrate on which a plurality of conductors are printed on the periphery of the opening;
   providing a plurality of first terminals by extending and folding the plurality of conductors on an inner part of the opening;
   providing a plurality of second terminals on the second device corresponding to the plurality of first terminals on the first device; and
   making the plurality of first terminals and the plurality of second terminals respectively come into contact by fitting the second device into the opening,
   wherein the first device is a cylinder head of an engine of an automobile, and the second device is an ignition coil device.

3. A connection method according to claim 1, further comprising the steps of:
   providing a positioning member for positioning the plurality of second terminals so that the plurality of second terminals respectively correspond to the plurality of first terminals in the second device; and
   providing a hole into which the positioning member is inserted in the first device.

4. A connection method of a first device and a second device involving an electrical connection, comprising the steps of:
   providing an opening on the first device for fitting the second device into the first device;
   arranging a substrate on which a plurality of conductors are printed on the periphery of the opening;
   providing a plurality of first terminals by extending and folding the plurality of conductors on an inner part of the opening;
   providing a plurality of second terminals on the second device corresponding to the plurality of first terminals on the first device;
   making the plurality of first terminals and the plurality of second terminals respectively come into contact by fitting the second device into the opening; and
   inserting annular seal members surrounding the fitting opening between the first device and the substrate and between the second device and the substrate.

5. A connection structure of a first device and a second device involving an electrical connection, comprising:
   an opening on the first device for fitting the second device;
   a substrate on which at least three conductors are printed on the periphery of the opening;
   at least three first terminals formed by extending and folding the at least three conductors of an inner part of the opening; and
   at least three second terminals on the second device corresponding to the at least three first terminals;
   wherein the at least three first terminals and the at least three second terminals come into contact by fitting the second device into the opening.

6. A connection structure of a first device and a second device involving an electrical connection, comprising:
   an opening on the first device for fitting the second device;
   a substrate on which a plurality of conductors are printed on the periphery of the opening;
   a plurality of first terminals formed by extending and folding the plurality of conductors on an inner part of the opening; and
   a plurality of second terminals on the second device corresponding to the plurality of first terminals;
   wherein the plurality of first terminals and the plurality of second terminals come into contact by fitting the second device into the opening,
   wherein the first device is a cylinder head of an engine of an automobile, and the second device is an ignition coil device.

7. A connection structure according to claim 5, further comprising:
   a positioning member for positioning the plurality of second terminals so that the plurality of second terminals respectively correspond to the plurality of first terminals in the second device; and
   a hole into which the positioning member is inserted in the first device.

8. A connection structure of a first device and a second device involving an electrical connection, comprising:
   an opening on the first device for fitting the second device;
   a substrate on which a plurality of conductors are printed on the periphery of the opening;
   a plurality of first terminals formed by extending and folding the plurality of conductors on an inner part of the opening; and
   a plurality of second terminals on the second device corresponding to the plurality of first terminals; and
   annular seal members surrounding the fitting opening between the first device and the substrate and between the second device and the substrate;
   wherein the plurality of first terminals and the plurality of second terminals come into contact by fitting the second device into the opening.

9. A connection method according to claim 4, wherein the first device is a cylinder head of an engine of an automobile, and the second device is an ignition coil device.

10. A connection method according to claim 4, further comprising the steps of:
    providing a positioning member for positioning the plurality of second terminals so that the plurality of second terminals respectively correspond to the plurality of first terminals in the second device; and
    providing a hole into which the positioning member is inserted in the first device.

11. A connection structure according to claim 8, wherein the first device is a cylinder head of an engine of an automobile, and the second device is an ignition coil device.

12. A connection structure according to claim 8, further comprising:
- a positioning member for positioning the plurality of second terminals so that the plurality of second terminals respectively correspond to the plurality of first terminals in the second device; and
- a hole into which the positioning member is inserted in the first device.

13. A connection method according to claim 2, further comprising the steps of:
- providing a positioning member for positioning the plurality of second terminals so that the plurality of second terminals respectively correspond to the plurality of first terminals in the second device; and
- providing a hole into which the positioning member is inserted in the first device.

14. A connection structure according to claim 6, further comprising:
- a positioning member for positioning the plurality of second terminals so that the plurality of second terminals respectively correspond to the plurality of first terminals in the second device; and
- a hole into which the positioning member is inserted in the first device.

* * * * *